(12) United States Patent
Li et al.

(10) Patent No.: US 12,131,928 B2
(45) Date of Patent: Oct. 29, 2024

(54) DYNAMIC DISPATCHING METHOD FOR SEMICONDUCTOR MANUFACTURING SYSTEM

(71) Applicant: TONG JI UNIVERSITY, Shanghai (CN)

(72) Inventors: Li Li, Shanghai (CN); Kuo-Yi Lin, Shanghai (CN); Jie Chen, Shanghai (CN); Yiguang Hong, Shanghai (CN); Qingyun Yu, Shanghai (CN); Peng Yi, Shanghai (CN); Jinlong Lei, Shanghai (CN); Xiouxian Li, Shanghai (CN); Min Meng, Shanghai (CN)

(73) Assignee: TONG JI UNIVERSITY, Shanghai (CN)

( * ) Notice: Subject to any disclaimer, the term of this patent is extended or adjusted under 35 U.S.C. 154(b) by 412 days.

(21) Appl. No.: 17/710,989

(22) Filed: Mar. 31, 2022

(65) Prior Publication Data

US 2022/0223444 A1     Jul. 14, 2022

Related U.S. Application Data

(63) Continuation of application No. PCT/CN2021/073947, filed on Jan. 27, 2021.

(30) Foreign Application Priority Data

Dec. 23, 2020 (CN) .......................... 202011537045.4

(51) Int. Cl.
*H01L 21/67* (2006.01)
*G05B 19/418* (2006.01)

(52) U.S. Cl.
CPC .. *H01L 21/67276* (2013.01); *G05B 19/41865* (2013.01); *G05B 19/41885* (2013.01); *G05B 2219/45031* (2013.01)

(58) Field of Classification Search
CPC .... G05B 2219/45031; G05B 19/41865; G05B 19/41885; H01L 21/37276

(Continued)

(56) References Cited

U.S. PATENT DOCUMENTS

| 7,010,364 | B1 * | 3/2006 | Singh ............... G05B 19/41885 |
| | | | 702/179 |
| 7,889,651 | B2 | 2/2011 | Feng et al. |
| 9,946,563 | B2 | 4/2018 | Geibel et al. |

FOREIGN PATENT DOCUMENTS

| CN | 103439886 | 12/2013 |
| CN | 106779220 | 5/2017 |

OTHER PUBLICATIONS

"International Search Report (Form PCT/ISA/210) of PCT/CN2021/073947," mailed on Oct. 9, 2021, pp. 1-4.

(Continued)

*Primary Examiner* — Monica D Harrison
(74) *Attorney, Agent, or Firm* — JCIP GLOBAL INC.

(57) ABSTRACT

A dynamic dispatching method for semiconductor manufacturing system relates to a dynamic dispatching rule based on self-organization for dispatching in a semiconductor manufacturing system, including S1: setting roles and parameters of self-organization units, and defining key nodes in a production environment; S2: constructing a negotiation mechanism between the self-organization units, and designing a decision-making and dispatching subject ESOU; S3: according to a decision instruction of the ESOU, designing a LSOU allocation dispatching unit for distinguishing single-batch processing and multi-batch processing; and S4: designing a dispatching mechanism based on the self-organization units to implement dynamic semiconductor dispatching. The dynamic dispatching method includes three aspects: role definitions of self-organization units, a negotiation mechanism between the self-organization units and a (Continued)

decision-making method thereof. The simulation based on a real industry benchmark production line shows that the method improves the work movement, throughput and on-time delivery rate by 4.9%, 9.06% and 20.23%.

3 Claims, 6 Drawing Sheets

(58) Field of Classification Search
USPC .............................................................. 438/5
See application file for complete search history.

(56) References Cited

OTHER PUBLICATIONS

"Written Opinion of the International Searching Authority (Form PCT/ISA/237) of PCT/CN2021/073947," mailed on Oct. 9, 2021, pp. 1-4.

* cited by examiner

DYNAMIC DISPATCHING METHOD FOR SEMICONDUCTOR MANUFACTURING SYSTEM

CROSS-REFERENCE TO RELATED APPLICATION

This application a continuation of international application of PCT application No. PCT/CN2021/073947 filed on Jan. 27, 2021, which claims the priority to Chinese patent application serial No. 202011537045.4, filed on Dec. 23, 2020. The entirety of the above-mentioned patent application is hereby incorporated by reference herein and made a part of this specification.

TECHNICAL FIELD

The present invention belongs to the field of semiconductor technology, and particularly relates to a dynamic dispatching method for a semiconductor manufacturing system

BACKGROUND TECHNIQUE

Semiconductor wafer manufacturing facilities are one of the most complex production processes used in industry. The main process usually includes 250 to 500 processing steps, and involves hundreds of different machines. These machines can be divided into single-processing machines, batch-processing machines (BPMs), multi-chamber processing machines, pipeline processing machines and wet desktop processing machines.

SUMMARY OF THE INVENTION

The objective of the present invention is to solve the dispatching problem in ensuring production efficiency due to the complexity of manufacturing operations in a semiconductor fab, and to propose an effective dynamic dispatching method for a semiconductor manufacturing system. This method involves a dynamic dispatching rule based on self-organization (DDRSO), and is mainly designed from the following three aspects: role definitions of self-organization units, a negotiation mechanism between the self-organization units and a decision-making method thereof.

The simulation of the present invention based on a simulation operation model of a real industry benchmark production line shows that, compared with the traditional heuristic dispatching strategy, the method has made great improvements in work movement, throughput and on-time delivery rate. Considering the workload and hot spots, the method can be extended to Extended-DDRSO. Under different workload levels, the E-DDRSO performs better than the DDRSO.

BRIEF DESCRIPTION OF THE DRAWINGS

By reading the following detailed description with reference to the accompanying drawings, the above and other objectives, features and advantages of the exemplary embodiments of the present invention will become easier to understand. In the drawings, a number of embodiments of the present invention are shown in an exemplary and non-limiting manner, in which.

DESCRIPTION OF THE EMBODIMENTS

Figure 1:
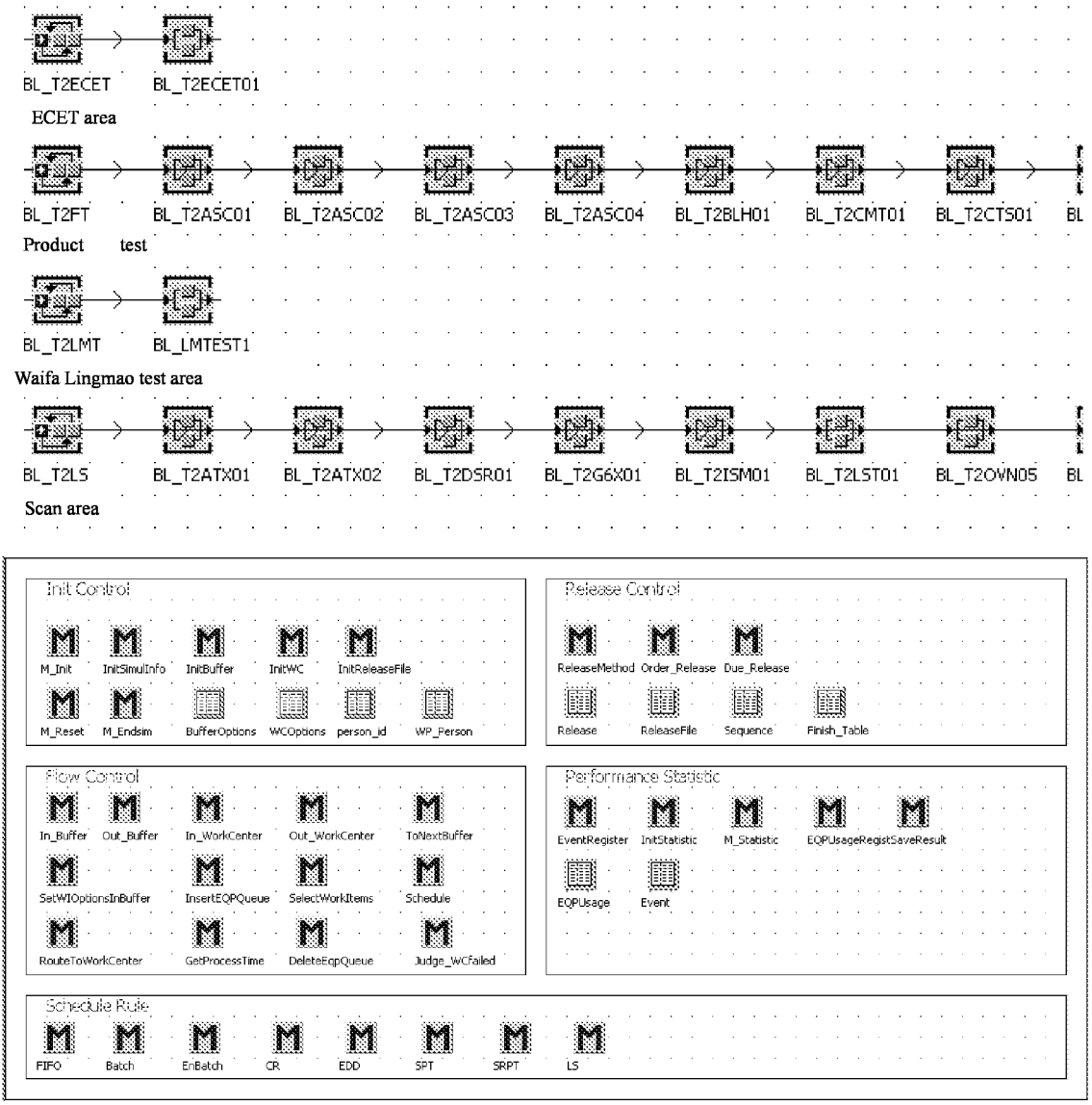
FIG. 1 is a control interface of a simulation model according to an embodiment of the present invention.
Figure 2:
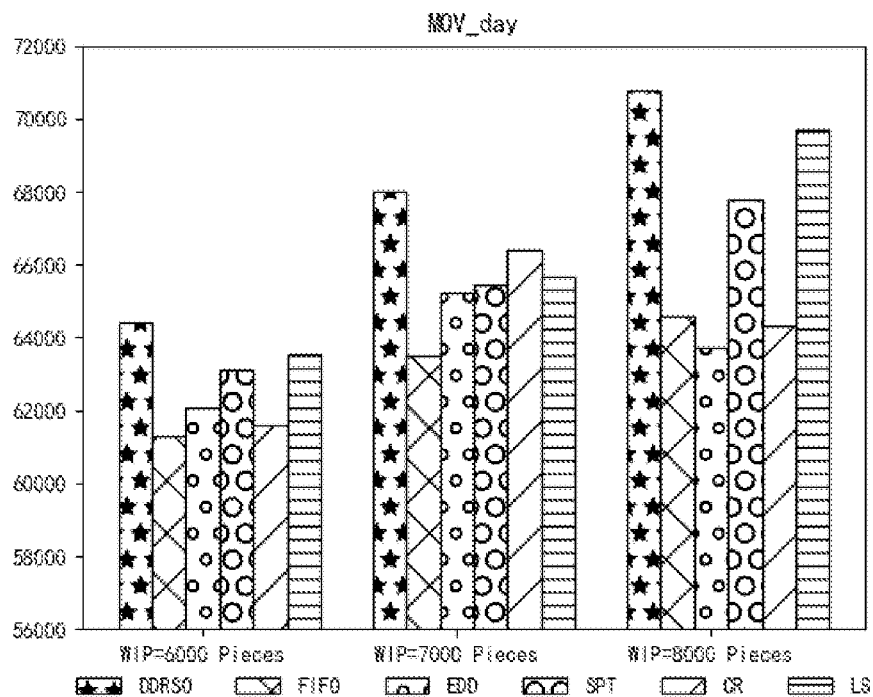
FIG. 2 is a schematic diagram of five heuristic dispatching rules compared to DDRSO according to an embodiment of the present invention.
Figure 2:
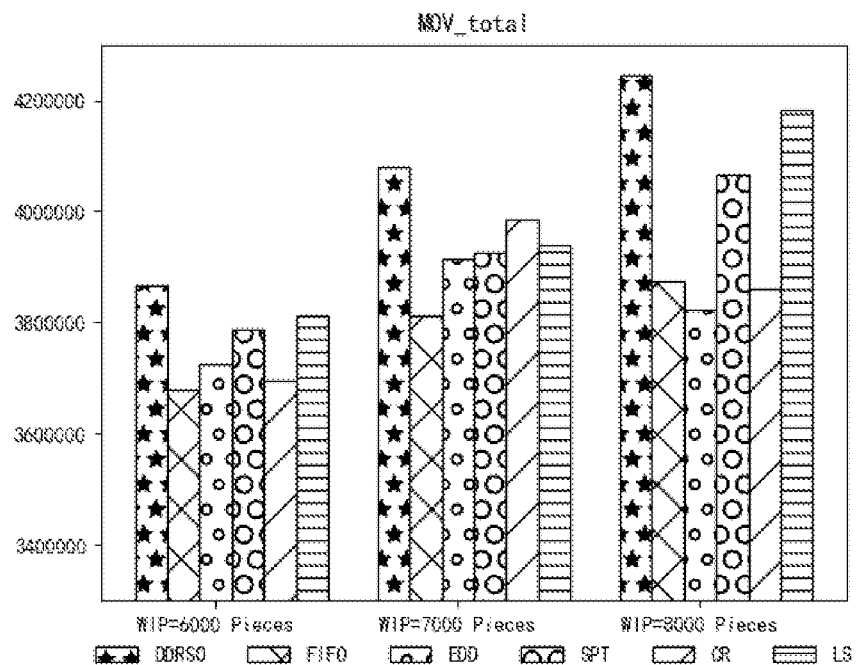
Figure 3:
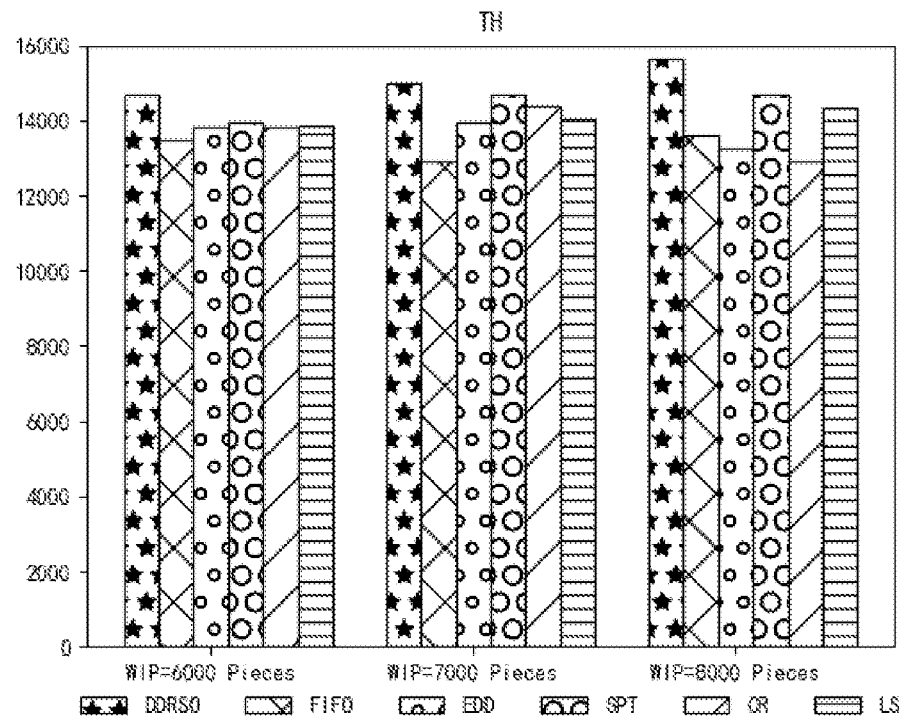
FIG. 3 is a schematic diagram showing a pattern of processing hard disk data according to an embodiment of the present invention.
Figure 4:
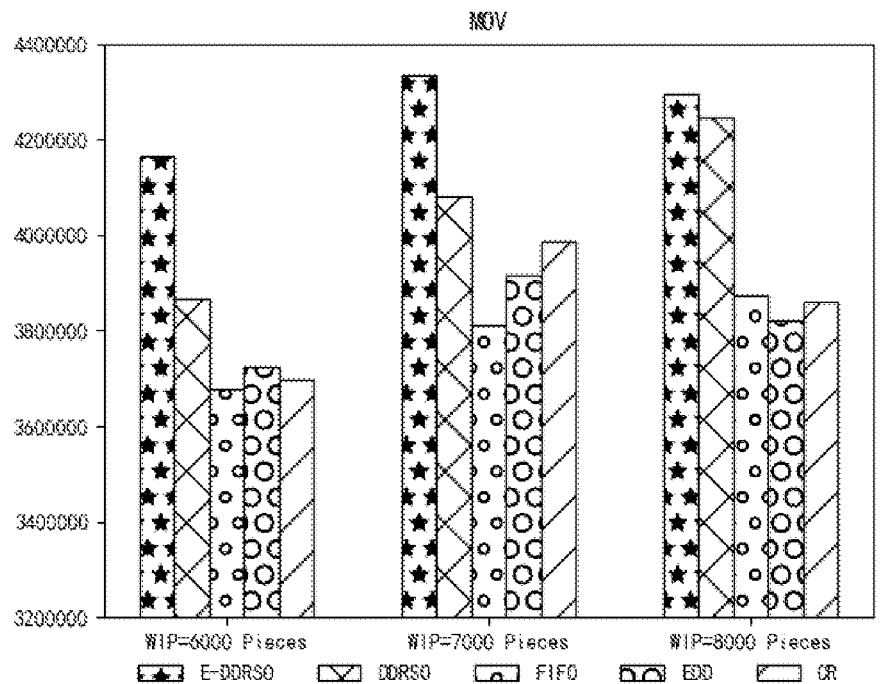
FIG. 4 is a schematic diagram of MOV comparison between E-DDRSO, DDRSO and other three heuristic dispatching rules according to an embodiment of the present invention.
Figure 5:
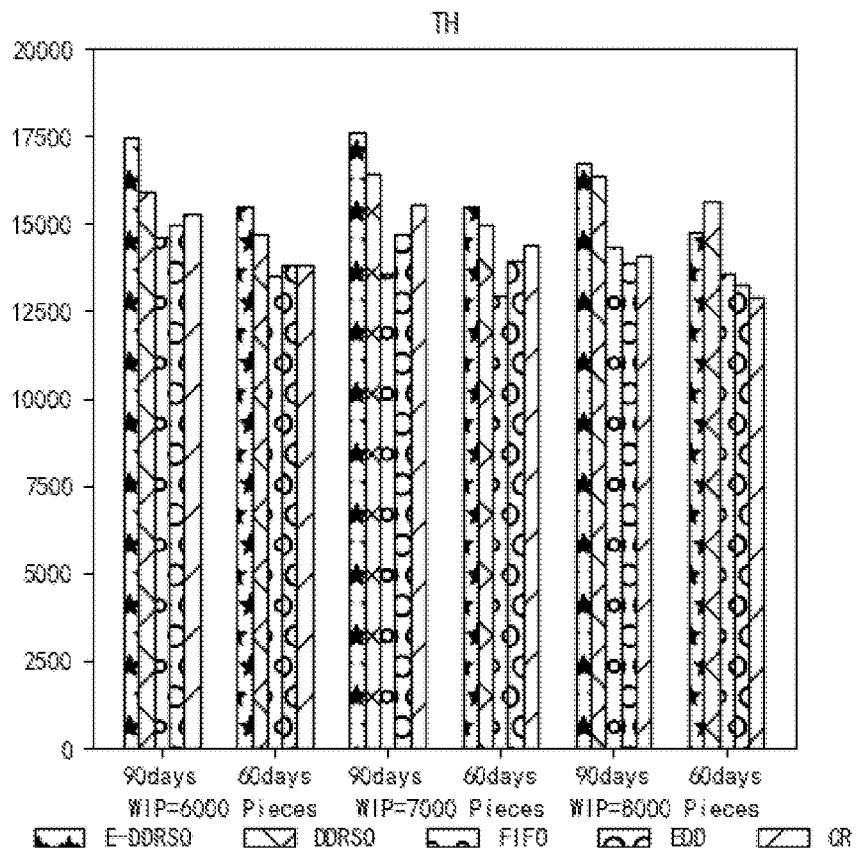
FIG. 5 is a schematic diagram of TH comparison between E-DDRSO, DDRSO and other three heuristic dispatching rules according to an embodiment of the present invention.
Figure 6:
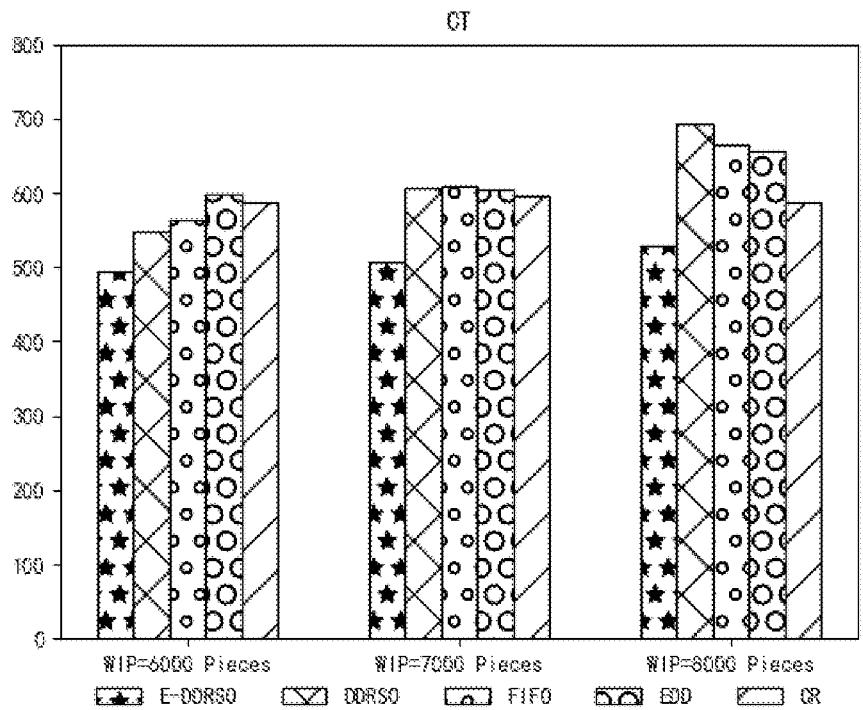
FIG. 6 is a schematic diagram of CT comparison between E-DDRSO, DDRSO and other three heuristic dispatching rules according to an embodiment of the present invention.
Figure 7:
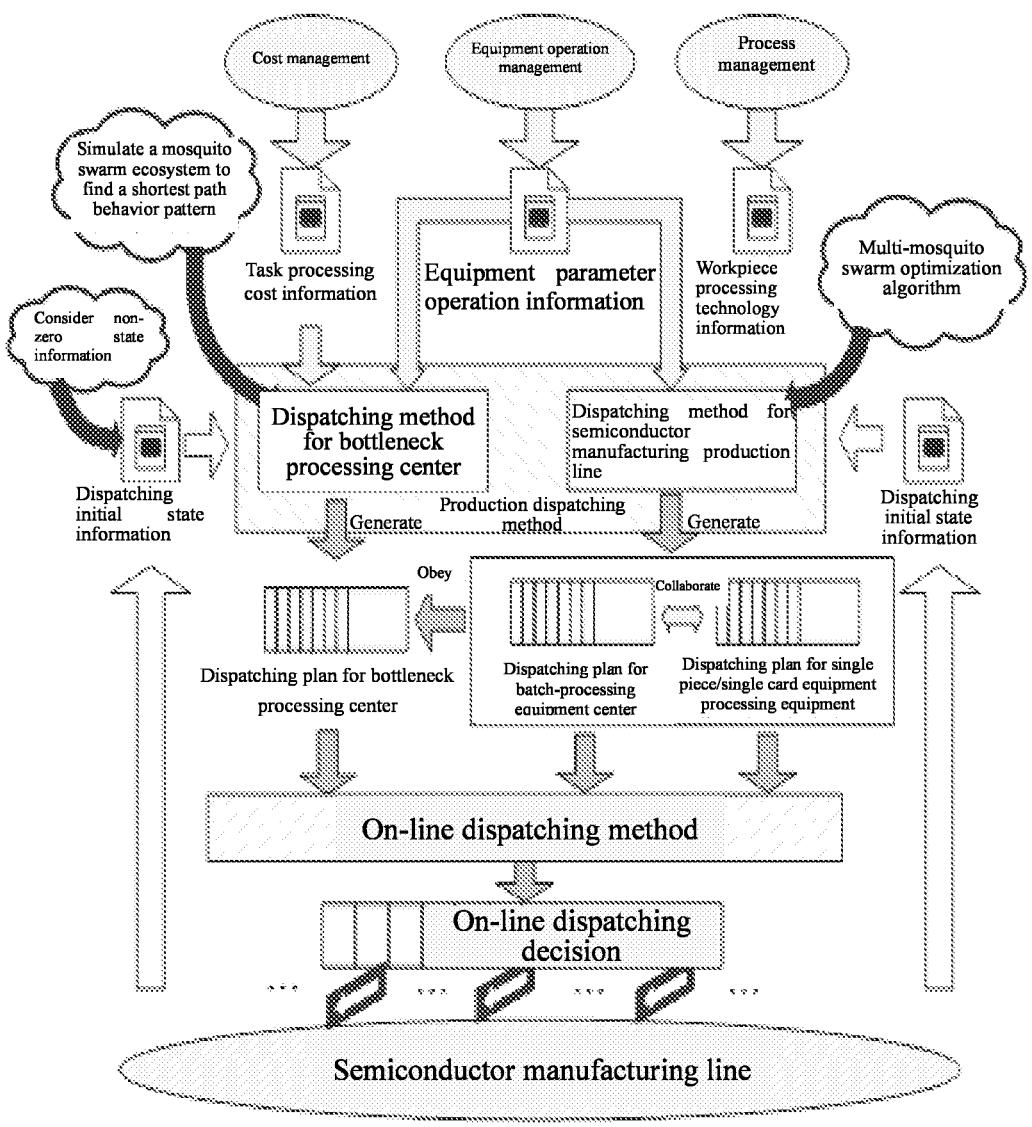
FIG. 7 is a flowchart of production dispatching according to an embodiment of the present invention.
Figure 8:
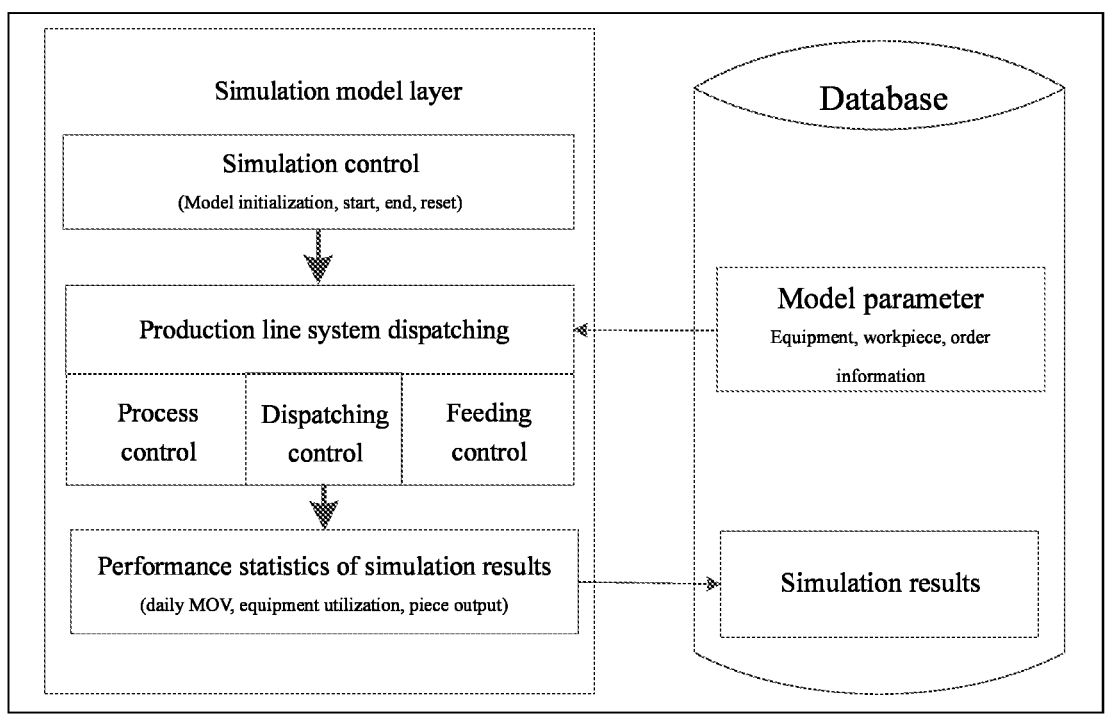
FIG. 8 is a schematic diagram of a dynamic dispatching simulation system of a semiconductor manufacturing system according to an embodiment of the present invention.

Production dispatching within a semiconductor manufacturing plant is a complex and arduous task. It has many considerable characteristics: demand fluctuations, different product versions, different work priorities, unbalanced production capacity, reentrant phenomena, hundreds of processing steps, alternative machines with the same recipe and changing bottlenecks. Due to extremely high capital investment, semiconductor manufacturers require relatively high overall equipment efficiency and utilization. Increased process complexity and reduced feature size lead to more frequent power outages, job rework, and other uncertainty issues. Therefore, dispatching methods must be able to quickly respond to real-time rework and outage. As an effective method, dynamic dispatching rules have attracted more and more attention in academia and industry. Meanwhile, because the relationship between upstream and downstream machines is complex and strong, it is best to adopt dynamic dispatching methods within fab ranges.

There are a large number of related researches in the field of semiconductor intelligent dispatching. By observing the experiential operations of transporting goods and considering the impact and limitations of overhead hoist transport (OHT), heuristic OHT dispatching rules can speed up the transportation of goods to reduce the workload, reduce the waiting time in an automatic material processing mode in 300 mm wafer manufacturing, and minimize the transportation delay, and the heuristic dispatching method can effectively speed up the movement of batches. Bottleneck detections and corresponding dynamic dispatching strategies can balance the workloads of bottleneck machines and non-bottleneck machines to prevent the occurrence of high-workload (WIP) bottleneck hunger and non-bottleneck. Compared with classic dispatching strategies such as first in first out (FIFO) and critical ratio (CR), this method has made improvements in average cycle time, cycle time variance and on-time delivery rate. Considering the characteristics of the bottleneck and the entire production line, a bottleneck prediction method of an improved adaptive network-based fuzzy inference system (ANFIS) can be obtained by predicting the workload and waiting time. Considering the bottleneck of equipment, the workload level of a bottleneck machine and the expiration date, a dynamic dispatching algorithm based on a release strategy can prevent bottleneck shortages, and balance work in process (WIP) and higher throughput. In order to cope with the complexity of multiple job plans in semiconductor test equipment, a dispatching algorithm based on a combination of heuristic best priority strategy and controlled backtracking strategy can reduce setup time. A two-level hierarchical production planning (HPP) method based on a production plan and an operation plan uses a linear programming (LP) model in an overall plan to obtain the production plan, uses a priority-based dispatching method to obtain dispatching on machines, and uses discrete event simulation for evaluation in the decomposition hierarchy. This method significantly exceeds the currently widely used heuristic dispatching algorithm in terms of total production cost and total order delay.

Self-organization is a system theory developed in the late 1960s. The self-organization is mainly used to solve the formation and development mechanism of a complex self-organizing system, and then reconstruct the system from disorder to order. Therefore, considering the dynamics and complexity of a dispatching problem, a self-organizing multi-stage and multi-product process dispatching method is used to overcome the dynamic dispatching problem of bottleneck machines. In the field of semiconductor production, the research of self-organizing dispatching strategies has made great progress. Based on the self-organizing method, the operation complexity of the dispatching system is reduced by integrating the dispatching system, configuration, optimization and integration into a single autonomous process that requires minimal manual intervention. Around the 1980s, an intelligent multi-controller system was proposed. The controller system includes three main mechanisms: a simulation-based training example generation mechanism, a data pre-processing mechanism, and a self-organizing map (SOM)-based MSR selection mechanism. These mechanisms can overcome the problem of long training time of traditional machine learning methods in the training sample generation stage. Under various long-term production performance standards, the intelligent multi-controller method has better system performance than fixed decision dispatching rules for each decision variable at the beginning of each production interval.

According to one or more embodiments, a dynamic dispatching rule based on self-organization (DDRSO) for a dispatching issue of a semiconductor manufacturing system includes: step S1: roles and parameters of self-organization units are set, and key nodes in a production environment are defined; step S2: a negotiation mechanism between the self-organization units is constructed, and a decision-making and dispatching subject ESOU is designed; step S3: according to a decision instruction of the ESOU, a LSOU allocation dispatching unit is designed for distinguishing single-batch processing and multi-batch processing; and step S4: a dispatching mechanism based on the self-organization units is designed to implement dynamic semiconductor dispatching. The present invention is mainly designed from the following three aspects: role definitions of self-organization units, a negotiation mechanism between the self-organization units and a decision-making method thereof. The simulation based on a simulation operation model of a real industry benchmark production line shows that, compared with the traditional heuristic dispatching strategies (including first in first out (FIFO) and critical ratio (CR) methods), the method improves the work movement, throughput and on-time delivery rate by 4.9%, 9.06% and 20.23%. Considering the workload and hot spots, the proposed method can also be extended to an Extended-dynamic dispatching rule based on self-organization (E-DDRSO). The simulation shows that the E-DDRSO performs better than the DDRSO at any workload level. In addition, compared with flexible dispatching methods, the E-DDRSO can also obtain better results, and especially shortens the cycle time (CT) by 16.51%.

The dispatching method of the embodiment of the present invention involves a dynamic dispatching rule based on self-organization (DDRSO). The method is mainly designed from the following three aspects: role definitions of self-organization units, a negotiation mechanism between the self-organization units and a decision-making method thereof. The simulation based on a simulation operation model of a real industry benchmark production line shows that, compared with the traditional heuristic dispatching strategy, the method improves the work movement, throughput and on-time delivery rate by 4.9%, 9.06% and 20.23%. First in first out (FIFO) and critical ratio (CR). Considering the workload and hot spots, the proposed method is extended to Extended-DDRSO. The simulation shows that the E-DDRSO performs better than the DDRSO at any workload level. In addition, compared with flexible dispatching methods, the E-DDRSO can also obtain better results, and especially shortens the cycle time (CT) by 16.51%.

According to one or more embodiments, a dynamic dispatching rule based on self-organization for a dispatching issue of a semiconductor manufacturing system includes:

Step S1: a lot self-organization unit (LSOU), which represents a batch of wafer modules that need to be dispatched, is constructed;

Step S11: $LSOU_i$ enters a buffer area of a machine group $E_L$;

Step S12: the workload $E_a$ of an ESOU representing each computer in the $E_L$ is calculated;

$$E_a = R_{pt\text{-}1} + R_{pt\text{-}2} + \ldots + R_{pt\text{-}m}$$

$R_{pt\text{-}m}$ refers to the processing time of the m batch in the $E_a$ queue.

Step S13: the ESOUs are sorted in ascending order, and then a computer with the minimum workload is selected;

$$\text{sort} = \{E_a\}_{up}^{1-n}$$

sort represents sorting in ascending order of the workload $E_a$.

Step S14: an RSOU or BSOU is generated through the LSOU in the buffer area of $E_a$.

Step S2: a recipe self-organization unit (RSOU), which represents a plan to be dispatched in the dispatching process, is constructed;

Step S3: a batch self-organization unit (BSOU), which represents multiple dispatching batches composed of the same dispatching plan and uses the current same dispatching equipment, is constructed;

Step S4: an equipment self-organization unit (ESOU) is constructed, the ESOU representing equipment in a fab and including a multi-batch ESOU and a single-batch ESOU. The ESOU is a main decision maker and executor in the production process, and is mainly responsible for selecting the appropriate RSOU or BSOU for processing on a machine;

Step S41: workloads of a non-batch-processing ESOU and a batch-processing ESOU are calculated respectively;

$$L_u = T_{unp} + T_r$$

$$L_b = T_{bmp} + T_r$$

Here, $L_u$ represents a total workload of the ESOU in non-batch-processing; $T_{unp}$ represents a theoretical total processing time of unprocessed batches in a waiting queue of non-batch-processing machines; $T_r$ represents the remaining processing time of processed batches on the current machine; $L_b$ represents the workload of the ESOU having batch-processing function; and $T_{bnp}$ represents a theoretical total processing time of unprocessed batches in a waiting queue of batch-processing machines.

Step S42: bottlenecks of non-batch-processing and batch-processing are calculated respectively;

$$B_u=(L_u-L_m)/L_m$$

$$B_b=(L_b-L_m)/L_m$$

Here, $B_u$ represents the degree of bottleneck of non-batch-processing equipment; $B_b$ represents the degree of bottleneck of batch-processing equipment; and $L_m$ represents the maximum processing capacity of the current equipment.

Step S43: sorting is performed in the order of the finished status in the current equipment, the degree of saturation of bottleneck, the degree of saturation of non-bottleneck, non-bottleneck blockage and bottleneck blockage;

$$sort_1=\{isFinished, b_n, n_{bf}, n_{bb}, b_b\}_{up}^{1\sim n}$$

isFinished represents that all tasks have been finished and are completely idle; $b_n$ represents the degree of hunger of bottleneck equipment; $n_b f$ represents the degree of idleness of non-bottleneck; $n_{bb}$ represents the degree of congestion in non-bottleneck processing; and $b_b$ represents the degree of congestion in bottleneck processing.

Step S44: the priorities of the RSOU and the BSOU are sorted in ascending order, where proTime represents processing time:

$$sort_2=\{proTime\}_{up}^{1\sim n}$$

Step S5: a processing resource self-organization unit (PSOU) is constructed for setting corresponding dispatching rules. Further, the instantaneous dynamic bottleneck is taken as a factor to be added to the dispatching rule, and dynamic bottleneck equipment related to equipment groups and equipment is determined.

Step S6: workloads of non-batch-processing and batch-processing equipment groups are calculated respectively:

$$L_u=\Sigma_{i=1}^n T_R+\Sigma_{i=1}^n T_E$$

$$L_b=(\Sigma_{i=1}^n T_R)/(maxBatch)+\Sigma_{i=1}^n T_E$$

$T_R$ is the queue processing time in the buffer area of the equipment group; $T_E$ is the remaining available time of equipment; and maxBatch represents the maximum processing capacity of the current equipment group (in batches).

Step S7: the maximum processing capacity of the current equipment group is calculated:

$$L_m=\max\{R_1, R_2, \ldots, R_m\}*equNum$$

$R_m$ represents the processing time of a recipe m in the equipment group; and equNum represents the number of equipment in the equipment group.

Step S8: whether there is a bottleneck in the non-batch-processing and batch-processing equipment is determined respectively:

$$isNonBatBot = \begin{cases} \sum_{i=1}^n T_R + \sum_{i=1}^n T_E \\ queLen > maxBatch \end{cases}$$

$$isBatBot = \begin{cases} L_b = \left(\sum_{i=1}^n T_R\right)/(maxBatch) + \sum_{i=1}^n T_E \\ queLen > maxbatch \end{cases}$$

queLen represents the number of lots queued in the buffer area; and maxBatch is the maximum number of batches that can be processed on the equipment.

Step S9: considering the important performance of on-time delivery rate, to ensure the rapid completion of emergency batches and increase the total on-time delivery rate, a certain proportion of emergency batches are randomly selected as static batches and due dates are set:

$$D_i=\Sigma_{j=1}^n T_{pti}*1.2$$

$D_i$ is the due date of a first batch of products to be delivered; and $T_{pti}$ is the processing time of each step in the i batch.

Step S10: the emergency batches are dynamically identified, and if a batch is likely to be delayed, it will dynamically become an emergency batch to ensure on-time delivery. The method for determining whether a batch can become an emergency batch is:

$$isDynEmergency = \begin{cases} T_T = \sum_{j=i}^n T_{pro} \\ T_P = DueDate - curTime \\ T_P \leq 1.2 T_T \end{cases}$$

$T_P$ represents the actual remaining processing time of the batch; $T_T$ represents the theoretical remaining processing time of the batch; and $T_{pro}$ represents the processing time of the batch in the current step.

The implementation example of the present invention realizes IIAP between self-organization units by dynamically integrating data board and peer-to-peer structures. For IIAP between ESOU and LSOU, the data board structure is preferred. For IIAP in ESOU, the peer-to-peer structure will be used. Considering multiple dynamic factors and hot spots, DDRSO can be further extended to E-DDRSO. Compared with DDRSO, E-DDRSO has made improvements in two aspects: role definition of self-organization units and consideration of hot spots.

Further, in order to prove the superiority of DDRSO and E-DDRSO, the following two dispatching methods are compared with another flexible dispatching method (BPSO-SVM). BPSO-SVM is a data-based dynamic dispatching strategy that uses a support vector machine (SVM) to implement a classification model. In addition, it uses binary particle swarm optimization (BPSO) to optimize a subset of production attributes (i.e. features), and finally creates the classification model for the dynamic dispatching strategy. Here, the simulation time is set to 90 days, and the data of the most recent 60 days is used. Next, data table 1 shows the comparison among the three dispatching methods BPSO-SVM, DDRSO and E-DDRSO, including light load (6000), medium load (7000) and heavy load (8000) pieces.

TABLE 1

Comparison table among three dispatching methods BPSO-SVM, DDRSO and E-DDRSO

|  | WIP(Pieces) | BPSO-SVM | DDRSO | E-DDRSO |
| --- | --- | --- | --- | --- |
| MOV(Steps) | 6000 | 3804819 | 3864936 | 4164240 |
|  | 7000 | 3989598 | 4080960 | 4333656 |
|  | 8000 | 4058184 | 4245672 | 4295016 |
| Improvement on MOV (%) | 6000 | — | 1.58 | 7.74 |
|  | 7000 | — | 2.29 | 6.19 |
|  | 8000 | — | 4.62 | 1.16 |
| Avg. Improvement on MOV (%) |  | — | 2.83 | 5.03 |
| TH(Pieces) | 6000 | 14157 | 14688 | 15456 |

TABLE 1-continued

Comparison table among three dispatching
methods BPSO-SVM, DDRSO and E-DDRSO

|  | WIP(Pieces) | BPSO-SVM | DDRSO | E-DDRSO |
|---|---|---|---|---|
|  | 7000 | 14244 | 14976 | 15456 |
|  | 8000 | 14330 | 15624 | 14760 |
| Improvement on TH (%) | 6000 | — | 3.75 | 5.23 |
|  | 7000 | — | 5.14 | 3.21 |
|  | 8000 | — | 9.03 | −5.53 |
| Avg. Improvement on TH (%) |  |  | 5.97 | 0.97 |
| CT (h) | 6000 | 561 | 548 | 495 |
|  | 7000 | 579 | 607 | 508 |
|  | 8000 | 618 | 692 | 529 |
| Improvement on CT (%) | 6000 | — | 2.32 | 9.67 |
|  | 7000 | — | −4.84 | 16.31 |
|  | 8000 | — | −11.97 | 23.55 |
| Avg. Improvement on CT (%) |  | — | −4.83 | 16.51 |

The following conclusions can be drawn:
Compared with BPSO-SVM and DDRSO, when WIP is 6000 and 7000 pieces, the MOV and TH of E-DDRSO show considerable advantages.
Compared with DDRSO and BPSO-SVM, E-DDRSO processes more emergent batches.
Compared with the prior art, the present invention has the following beneficial effects:
1. Compared with traditional heuristic dispatching rules, regardless of the system load, multiple performances of DDRSO, including WIP number, on-time delivery rate, etc. have achieved better effects.
2. When WIP is 6000, 7000 and 8000 pieces, compared with other traditional heuristic dispatching rules, the average ODR of DDRSO is increased by 39.64%, 13.87% and 7.17% respectively.
3. According to the characteristics of semiconductor dispatching, when the impact of multiple dynamic factors and hot spots is considered, DDRSO can be extended to E-DDRSO, and E-DDRSO has better performance than DDRSO.
4. Compared with other intelligent dispatching algorithms, such as BPSO-SVM and E-DDRSO, when the WIP is 6000 and 7000 pieces, the MOV and TH of E-DDRSO show considerable advantages. When WIP is 8000 pieces, E-DDRSO also has certain improvements.

The terms involved in this specification are as follows:
Lot self-organization unit (LSOU);
Recipe self-organization unit (RSOU);
Batch self-organization unit (BSOU);
Equipment self-organization unit (ESOU);
Dynamic dispatching rule based on self-organization (DDRSO);
Work in process (WIP);
On-time delivery rate (ODR);
Extended-dynamic dispatching rule based on self-organization (E-DDRSO);
Interactive information accession pattern (IIAP);
Batch-processing machines (BPM);
Cycle time (CT);
Overhead hoist transport (OHT);
First in first out (FIFO);
Critical ratio (CR);
Adaptive network-based fuzzy inference system (ANFIS);
Two-level hierarchical production planning (HPP);
Linear programming (LP);
Self-organizing map (SOM).

It is worth noting that although the foregoing content has described the spirit and principle of the present invention with reference to a number of specific embodiments, it should be understood that the present invention is not limited to the disclosed specific embodiments, the division of various aspects does not mean that the features in these aspects cannot be combined, and this division is only for the convenience of description. The present invention is intended to cover various modifications and equivalent arrangements included within the spirit and scope of the appended claims.

What is claimed is:

1. A dynamic dispatching method for a semiconductor manufacturing system, comprising the following steps:
setting roles and parameters of self-organization units in the semiconductor manufacturing system, and defining key nodes in a production environment;
constructing a negotiation mechanism between the self-organization units, and designing a decision-making and a dispatching subject equipment self-organization unit (ESOU);
according to a decision instruction of the dispatching subject ESOU, designing a lot self-organization unit (LSOU) allocation dispatching unit for distinguishing a single-batch processing and a multi-batch processing;
designing a dispatching mechanism based on the self-organization units to implement a dynamic semiconductor dispatching;
S1, constructing a processing object lot self-organization unit (LSOU), the processing object LSOU representing a batch of wafer modules that need to be dispatched;
S2, constructing a recipe self-organization unit (RSOU), the RSOU representing a wafer to-be-dispatched plan in a dispatching process;
S3, according to batch requirements of a semiconductor dispatching, constituting a batch of multiple kinds of semiconductor wafers for processing on a same equipment, and constructing a batch self-organization unit (BSOU), the BSOU representing multiple dispatching batches composed of a same dispatching plan and using a current same dispatching equipment;
S4, constructing an equipment self-organization unit (ESOU), the ESOU representing an equipment in a semiconductor system and comprising a multi-batch ESOU and a single-batch ESOU;
S5: a processing resource self-organization unit (PSOU) is constructed for setting corresponding dispatching rules;
S6, calculating workloads of a non-batch-processing equipment group Lu and a batch-processing equipment group L, respectively, $$L_u = \Sigma_{i=1}^n T_R + \Sigma_{i=1}^n T_E \qquad (1)$$

$$L_b = (\Sigma_{i=1}^n T_R)/(\text{maxBatch}) + \Sigma_{i=1}^n T_E \qquad (2)$$

$T_R$ where is a queue processing time in a buffer area of an equipment group; $T_E$ is a remaining available time of the equipment; and maxBatch represents a maximum processing capacity of a current equipment group (in batches);
S7, calculating the maximum processing capacity Lm of the current equipment group, $$L_m = \max\{R_1, R_2, \ldots, R_m\} * \text{equNum} \qquad (3)$$

$R_m$ represents a processing time of a recipe m in the equipment group; and equNum represents a number of the equipment in the equipment group;

S8, respectively determining whether there are bottlenecks in a non-batch-processing and a batch-processing equipment, $$isNonBatBot = \begin{cases} \sum_{i=1}^{n} T_R + \sum_{i=1}^{n} T_E \\ queLen > maxBatch \end{cases}$$

$$isBatBot = \begin{cases} L_b = \left(\sum_{i=1}^{n} T_R\right)/(maxBatch) + \sum_{i=1}^{n} T_E \\ queLen > maxbatch \end{cases}$$

queLen where represents a number of lots queued in the buffer area; and maxBatch is a maximum number of the batches that can be processed on the equipment;

S9, to ensure a rapid completion of emergency batches and increase a total on- time delivery rate, randomly selecting a certain proportion of the emergency batches as static batches and setting due dates:

$$D_i = \Sigma_{j=1}^{n} T_{pti} * 1.2$$

where $D_i$ is the due date of a first batch of products to be delivered; and $T_{pti}$ is the processing time of each step in a i batch; and S10, dynamically identifying the emergency batches, wherein if one of the batches is likely to be delayed, it will dynamically become one of the emergency batches to ensure on-time delivery, and wherein a method for determining whether the batches can become the emergency batch is:

$$isDynEmergency = \begin{cases} T_T = \sum_{j=i}^{n} T_{pro} \\ T_P = DueDate - curTime \\ T_P \leq 1.2 T_T \end{cases}$$

where $T_p$ represents an actual remaining processing time of the batches; $T_T$ represents a theoretical remaining processing time of the batches; and $T_{pro}$ represents the processing time of the batches in a current step; DueDate is a theoretical delivery date, and curTime is a current time.

2. The dynamic dispatching method for the semiconductor manufacturing system according to claim 1, wherein the step S1 specifically comprises:
S11, $LSOU_i$ entering a buffer area of a machine group $E_L$;
S12, calculating a total workload $E_a$ of ESOUs of each of a processing equipment in $E_L$;
$E_a = R_{pt-1} + R_{pt-2} + \ldots + R_{pt-m}$
where $R_{pt-m}$ refers to a processing time of a m batch in a $E_a$ queue;
S13, sorting the ESOUs in an ascending order, and then selecting the processing equipment with a minimum workload;

$$sort = \{E_a\}_{up}^{1-n}$$

sort where represents sorting in the ascending order of a workload $E_a$;
S14, generating the RSOU or the BSOU through a LSOU in the buffer area of a $E_a$.

3. The dynamic dispatching method for the semiconductor manufacturing system according to claim 1, wherein the step S1 specifically comprises:
S41, calculating the workloads of a non-batch-processing ESOU and a batch-processing ESOU respectively, $$L_u = T_{unp} + T_r$$

$$L_b = T_{bnp} + T_r$$

Here, $L_u$ represents a total workload of the ESOU in the non-batch-processing; $T_{unp}$ represents a theoretical total processing time of unprocessed batches in a waiting queue of non-batch-processing machines; $T_r$ represents a remaining processing time of processed batches on a current machine; $L_p$ represents the workloads of the ESOU having a batch-processing function; and $T_{bnp}$ represents the theoretical total processing time of the unprocessed batches in the waiting queue of batch-processing machines;
S42, calculating the bottlenecks of the non-batch-processing ESOU and the batch-processing ESOU respectively;

$$B_u = (L_u - L_m)/L_m$$

$$B_b = (L_b - L_m)/L_m$$

Here, $B_u$ represents a degree of the bottlenecks of a non-batch-processing equipment; $B_b$ represents the degree of the bottlenecks of the batch-processing equipment; and $L_m$ represents the maximum processing capacity of a current equipment;
S43, performing sorting in an ascending order of a finished status in the current equipment, the degree of a hunger of the bottlenecks, the degree of an idleness of a non-bottleneck, a non-bottleneck blockage and a bottleneck blockage;

$$sort_1 = \{isFinished, b_n, n_{bf}, n_{bb}, b_b\}_{up}^{1-n}$$

where isFinished represents that all tasks have been finished and are completely idle; $b_n$ represents the degree of the hunger of bottleneck equipment; $n_{bf}$ represents the degree of the idleness of the non-bottleneck; $n_{bb}$ represents the degree of a congestion in non-bottleneck processing; and $b_b$ represents the degree of the congestion in bottleneck processing;
S44, sorting priorities of the RSOU and the BSOU in the ascending order, where proTime represents the processing time, $$sort_2 = \{proTime\}_{up}^{1-n}.$$

* * * * *